(12) United States Patent
Bhavaraju et al.

(10) Patent No.: US 8,587,906 B2
(45) Date of Patent: Nov. 19, 2013

(54) PHOTOVOTAIC SYSTEM INCLUDING HYBRID BI-DIRECTIONAL DC CONTACTORS AND METHOD OF DETECTION AND ISOLATION OF FAULTS THEREIN

(75) Inventors: Vijay Bhavaraju, Germantown, WI (US); Tiefu Zhao, Milwaukee, WI (US); Peter J. Theisen, West Bend, WI (US)

(73) Assignee: Eaton Corporation, Cleveland, OH (US)

( * ) Notice: Subject to any disclaimer, the term of this patent is extended or adjusted under 35 U.S.C. 154(b) by 42 days.

(21) Appl. No.: 13/440,275

(22) Filed: Apr. 5, 2012

(65) Prior Publication Data

US 2013/0264883 A1    Oct. 10, 2013

(51) Int. Cl.
*H02H 3/00*    (2006.01)
(52) U.S. Cl.
USPC .................................. 361/42; 361/8
(58) Field of Classification Search
USPC .................. 361/8, 42; 136/244, 246
See application file for complete search history.

(56) References Cited

U.S. PATENT DOCUMENTS

| | | | |
|---|---|---|---|
| 4,356,525 A | 10/1982 | Kornrumpf et al. | |
| 4,360,847 A | 11/1982 | Bloomer et al. | |
| 4,992,904 A | 2/1991 | Spencer et al. | |
| 5,057,962 A | 10/1991 | Alley et al. | |
| 6,650,245 B2 | 11/2003 | Chung | |
| 7,079,363 B2 | 7/2006 | Chung | |
| 2008/0143462 A1 | 6/2008 | Belisle et al. | |
| 2010/0254046 A1* | 10/2010 | Liu et al. | 361/8 |
| 2012/0050924 A1* | 3/2012 | Matsuo et al. | 361/42 |

* cited by examiner

*Primary Examiner* — Danny Nguyen
(74) *Attorney, Agent, or Firm* — Ziolkowski Patent Solutions Group, SC

(57) ABSTRACT

A photovoltaic (PV) power system is disclosed that includes hybrid DC contactors corresponding to each of a plurality of PV strings, with each hybrid DC contactor having main contacts, a solid state switching unit positioned in parallel with the main contacts, and sensors configured to measure a voltage and current on respective PV strings. A controller is provided in the PV power system that is configured to receive voltage and current data on the PV strings, detect a fault condition on a respective PV string based on the voltage and current data, cause the main contacts of a respective hybrid DC contactor to remain closed on each PV string for which a fault condition is detected, and cause the main contacts of a respective hybrid DC contactor to open on each PV string for which no fault condition is detected, so as to clear the fault condition.

25 Claims, 10 Drawing Sheets

PHOTOVOTAIC SYSTEM INCLUDING HYBRID BI-DIRECTIONAL DC CONTACTORS AND METHOD OF DETECTION AND ISOLATION OF FAULTS THEREIN

BACKGROUND OF THE INVENTION

The present invention relates generally to photovoltaic (PV) power systems and, more particularly, to a PV power system that incorporates a set of hybrid DC contactors in order to provide for unique autonomous fault detection in individual PV strings or sub-arrays and a control system that employs logic for purposes of clearing faults and restoring healthy sub-arrays or PV strings.

PV power systems are power systems that employ a plurality of solar modules to convert sunlight into electricity. PV systems include multiple components, including photovoltaic modules, mechanical and electrical connections and mountings, and means of regulating or modifying the electrical output. One common arrangement in PV systems is for several PV modules to be connected in series to form a PV string, with multiple PV strings in a PV system then being combined in parallel to aggregate the current in a PV array. The PV modules generate direct current (DC) power, with the level of DC current being dependent on solar irradiation and the level of DC voltage dependent on temperature. When alternating current (AC) power is desired, an inverter is used to convert the DC energy from the array into AC energy, such as AC energy suitable for transfer to a power grid.

PV power systems also include a balance-of-system comprising DC switching and protection devices, combiner boxes, circuit breakers, disconnect switches, and contactors. Combiner boxes aggregate the DC power from the PV strings and provide a parallel connection point (i.e., a common bus) for the PV strings, with the combiner box providing overcurrent protection and isolation. Combiner boxes are either source combiners or array combiners, with source combiners being located closer to the PV strings and array combiners— or re-combiners—aggregating outputs from several source combiners into a single circuit.

It is recognized that there are several system design and component challenges associated with the operation of PV power systems. For example, overcurrent protection on a short circuit in the PV power system may have, at best, an over-current magnitude of 1.1× the rated current, thus making it impossible to provide over-current and short circuit detection and protection in PV power systems with conventional fuses and circuit breakers. Additionally, it is recognized that in a PV power system, a fault condition on a PV string is characterized by a current flow that is in a reverse direction from a current flow on a normally operating PV string, with the fault current also being many times greater than the current on a normally operating PV string (e.g., 1.1× with one parallel string to 100× when many parallel strings are present), such that traditionally there has not been a "one size fits all" solution to address such faults in a PV power system. Furthermore, existing switches in PV power systems cannot be automatically reset/reclosed after isolation of a faulted circuit so as to restore a circuit with healthy strings or combiner boxes—as would be desired in combiner boxes that are remote and not easily accessible. Another important function of the DC hybrid contactor is to integrate with arc-fault detection or ground fault detection methods and isolate the faulted sub-arrays/arrays. Breakers with shunt trips can be integrated but have the limitation of requiring a manual reset process. Still further, in existing PV power systems that employ conventional switches that cannot be remotely operated, it is not possible to continue to supply power in a PV system while the fault condition on a particular PV string is being addressed, such that the PV power system can continue to operate even while the fault is being addressed. This causes undesirable down time.

It would therefore be desirable to provide a PV power system and method for fault detection therein that provides over-current and short circuit detection with fault current and voltages specific to PV Systems and fault location with autonomous fault current direction detection and a DC remotely operated switch for isolating faulted circuit. It would further be desired to for such a PV system to provide the capability to remotely and/or automatically reclose contacts after isolating and restoring a faulted circuit and to continue to generate power while the faulted circuit is being addressed, such that the PV power system can continue to operate even while the fault is being addressed. It would further be desired for such a PV system to provide an enhanced level of service by integrating arc-fault detection, ground-fault detection, and leakage detection in floating arrays.

BRIEF DESCRIPTION OF THE INVENTION

The present invention provides a system and method for controlling operation of a PV power system that incorporates hybrid DC contactors in order to provide for unique autonomous fault detection in individual PV strings and sub-arrays, clearing faults, and restoring healthy sub-arrays/PV strings In accordance with one aspect of the present invention, a photovoltaic (PV) power system includes a plurality of PV strings configured to generate a string output power responsive to received solar irradiation and a combiner box having a DC link therein connected to the plurality of PV strings, wherein the plurality of PV strings are connected to the DC link in a parallel arrangement. The PV power system also includes a hybrid direct current (DC) contactor positioned in the combiner box and corresponding to each of the plurality of PV strings, with each hybrid DC contactor having main contacts movable between a closed position and an open position, a solid state switching unit positioned in parallel with the main contacts and that includes a semiconductor switch that, when turned on, diverts current away from the main contacts, and sensors configured to measure a voltage and current on the respective PV string. The PV power system further includes a controller configured to receive voltage and current data from respective sensors on each of the plurality of PV strings, detect a fault condition on a respective PV string based on the received voltage and current data, cause the main contacts of a respective hybrid DC contactor to remain closed on each PV string for which a fault condition is detected, and cause the main contacts of a respective hybrid DC contactor to open on each PV string for which no fault condition is detected, so as to clear the fault condition.

In accordance with another aspect of the invention, a photovoltaic (PV) power system including a plurality of PV strings configured to generate a string output power responsive to received solar irradiation, a combiner box connected to the plurality of PV strings and including a DC link therein to which the plurality of PV strings are connected in a parallel arrangement, a re-combiner box connected to the combiner box and including a plurality of sub-arrays therein corresponding to the plurality of PV strings, and a plurality of hybrid direct current (DC) contactors positioned in the combiner box and re-combiner box on each of the plurality of PV strings and each of the plurality of sub-arrays. Each hybrid DC contactor includes main contacts movable between a closed position and an open position, a solid state switching unit positioned in parallel with the main contacts that includes a semiconductor switch that, when turned on, diverts current away from the main contacts, and sensors configured to measure a voltage and current. The PV power system also includes a controller configured to receive voltage and current data from respective sensors, detect a fault condition on a respective PV string or sub-array based on the received current data, and control an opening and closing of the main contacts of the respective hybrid DC contactors in order to isolate and clear the fault condition.

In accordance with yet another aspect of the invention, a method of controlling operation of a photovoltaic (PV) power system includes measuring at least one of a voltage and current for a plurality of PV strings in the PV system, detecting a fault condition on a respective PV string based on the at least one of the measured voltage and current, and controlling operation of a plurality of hybrid DC contactors connected to the a plurality of PV strings in order to isolate and clear the fault condition. The step of controlling operation of the plurality of hybrid DC contactors further includes causing main contacts of a respective hybrid DC contactor to remain closed on each PV string for which a fault condition is detected and causing the main contacts of a respective hybrid DC contactor to open on each PV string for which no fault condition is detected, so as to clear the fault condition.

Various other features and advantages of the present invention will be made apparent from the following detailed description and the drawings.

BRIEF DESCRIPTION OF THE DRAWINGS

The drawings illustrate preferred embodiments presently contemplated for carrying out the invention.

In the drawings.

DETAILED DESCRIPTION OF THE PREFERRED EMBODIMENTS

The embodiments of the invention set forth herein relate to a system and method for fault detection and isolation of a PV power system that incorporates hybrid DC contactors in order to provide for unique autonomous fault current and direction detection in individual PV strings and a control system that employs logic for purposes of clearing faults and restoring healthy sub-arrays and PV strings.

Figure 1:
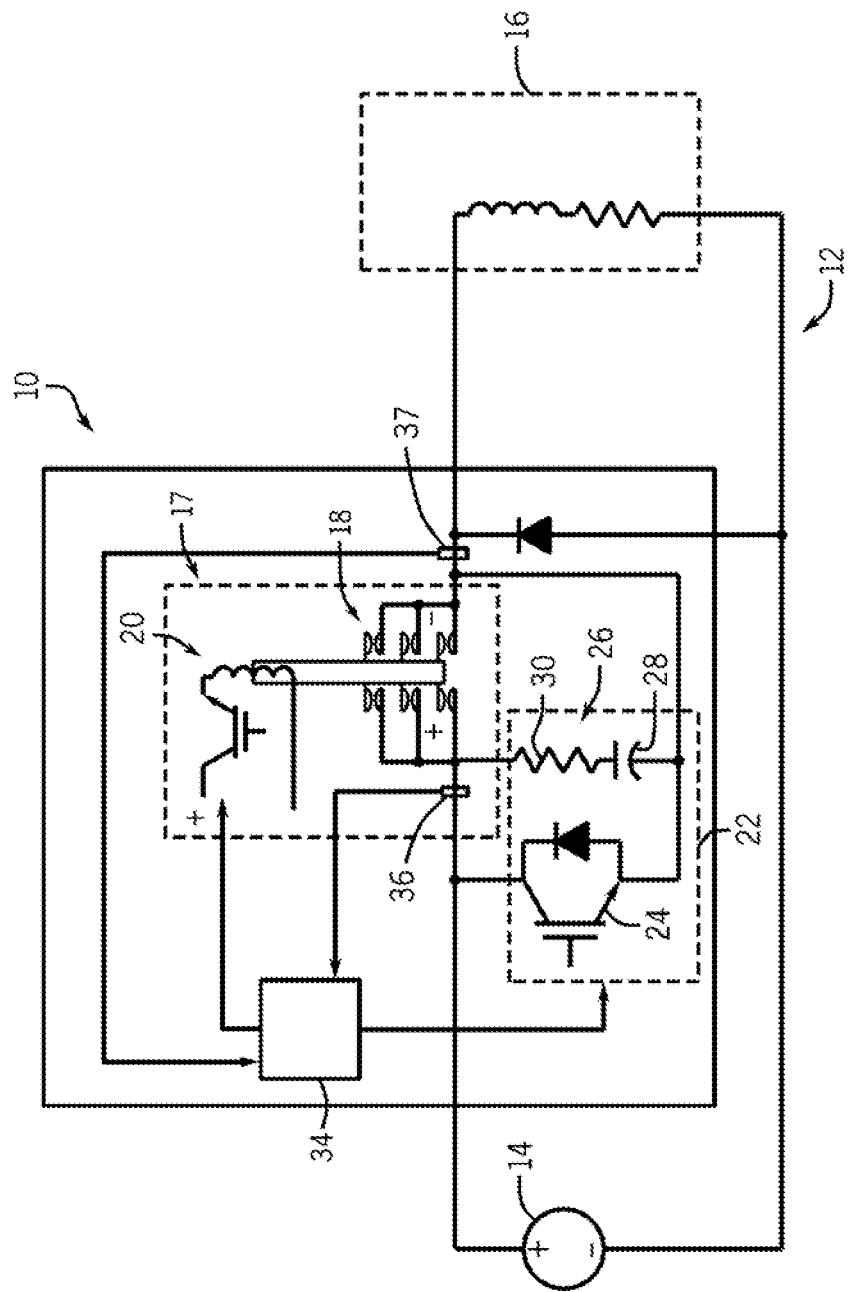
FIG. 1 is a schematic view of a power circuit incorporating a hybrid DC contactor according to an embodiment of the present invention.

According to an exemplary embodiment of the invention, a PV power system incorporates a hybrid DC contactor such as the hybrid DC contactor 10 illustrated in the circuit diagram of FIG. 1. As depicted in FIG. 1, hybrid DC contactor 10 is incorporated into a circuit 12 that includes a DC power source 14 and a load 16, such as a PV inverter or a combiner box. According to one embodiment of the invention, and as shown in FIG. 1, the DC power source 14 is selectively connected to and separated from DC load 16 through a standard AC electro-mechanical contactor 17 (i.e., multi-pole arrangement) that includes a plurality of mechanical main contacts/poles 18, with the contacts being in the form of movable contacts and fixed contacts. The main contacts 18 of the standard electro-mechanical contactor 17 provide a first current path between the power source 14 and load 16 when the movable contacts thereof are in a closed position. According to one embodiment of the invention, and as shown in FIG. 1, the standard electro-mechanical contactor 17 may be constructed as a three-pole AC contactor, where three main contacts 18 are positioned in a parallel arrangement. It is recognized, however, that other constructions of electro-mechanical contactors 17 are considered within the scope of the invention, such that the electro-mechanical contactor 17 may include a different number of contacts/poles 18 in different arrangements. Additionally, it is recognized that the electro-mechanical contactor 17 could be replaced by a relay or a breaker, according to additional embodiments of the invention.

Figure 3:
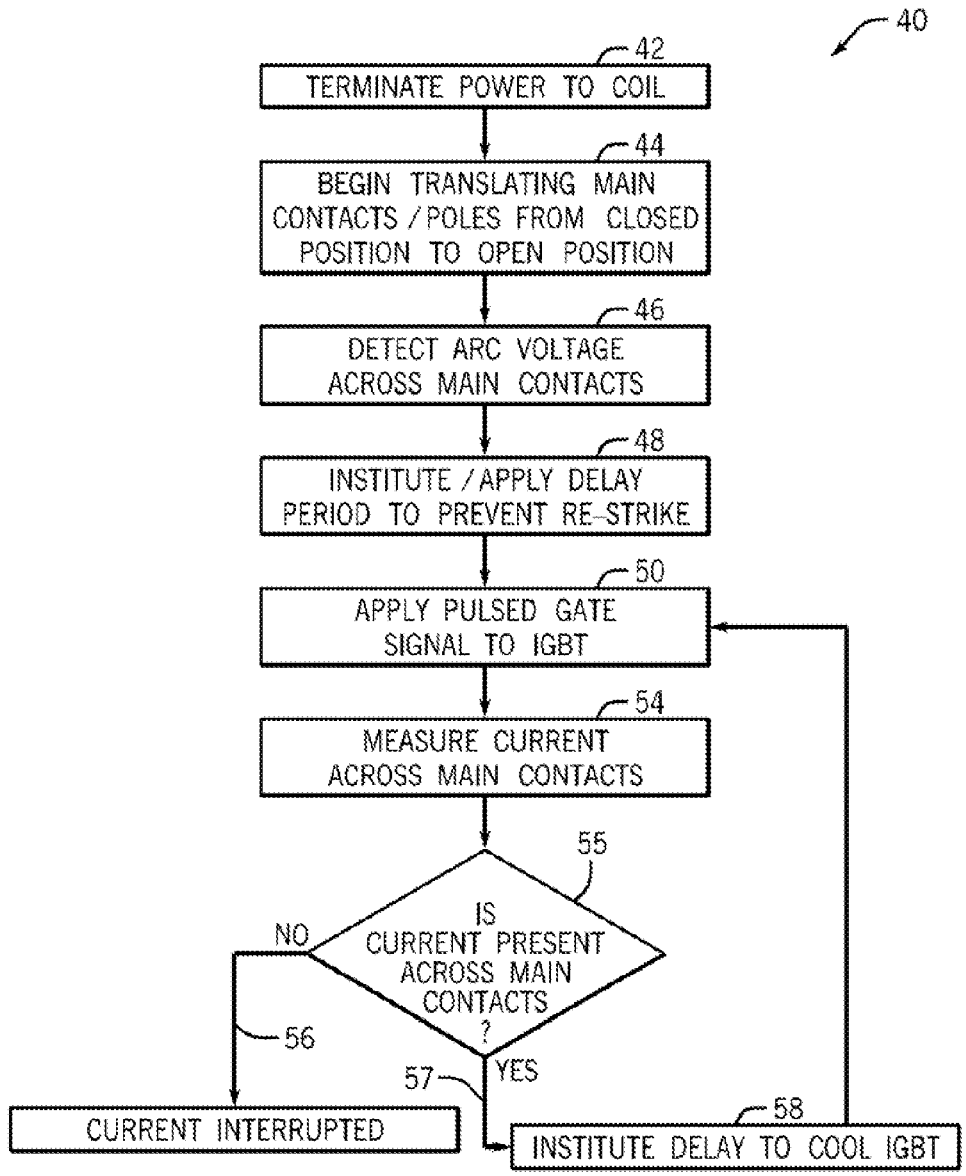
FIGS. 3 and 4 are a flowchart and timeline respectively illustrating a control scheme for operating the hybrid DC contactor of FIG. 1 according to an embodiment of the invention.

As shown in the hybrid DC contactor 10 of FIG. 1, for controlling actuation of the movable contacts, the electromechanical contactor 17 includes an electromagnetic coil 20 that is positioned in proximity to the contacts 18, with the electromagnetic coil 20 acting to impart a force on the movable contacts 18 when closing and with a spring (not shown) being used to open the contacts. When power is provided to the electromagnetic coil 20, this force is applied to the contacts 18 to cause the movable contacts to close. When power is terminated to the electromagnetic coil 20, the force is removed, and a spring (not shown) that normally biases the movable contacts in the open position, acts to cause the movable contacts to translate from the closed position to the open position. This opening action takes several milliseconds (e.g., 11 ms, as shown in FIG. 3).

The hybrid DC contactor 10 further includes a solid state device 22 that is connected/positioned in parallel with the electro-mechanical contactor 17, such that the solid state device 22 provides a second, parallel current path that diverts current away from the electro-mechanical contactor 17 when the switching unit is turned on. Specifically, the solid state device 22 includes a semiconductor switch 24, such as an insulated-gate bipolar transistor (IGBT) switch or other suitable switch, that can be selectively turned on and off to divert current away from the main contacts 18 of electro-mechanical contactor 17. The solid state device 22 also includes a snubber circuit 26 in parallel with the IGBT 24, with the snubber circuit 26 having a capacitor 28 and a resistor 30 in series that function to suppress voltage transients in the solid state device 22, so as to protect the IGBT 24. According to one embodiment of the invention, a free-wheeling diode 32 is also included in hybrid DC contactor 10 to circulate inductive load currents, such that the source circuit is quickly isolated.

In operation, when it is desired to actuate the movable contacts 18 from a closed position to an open position, a supply power provided to electromagnetic coil 20 is terminated and the IGBT 24 is turned on, such that the current flowing through the main contacts 18 is caused to flow through the IGBT 24 and the main contacts 18 can be opened with minimal arcing occurring across the main contacts. For controlling operation of the electromagnetic coil 20 and the solid state device 22, one or more controllers 34 (shown as a single controller in FIG. 1) is provided that functions to control supplying of power to electromagnetic coil 20 and the generating of gate signals for controlling the on/off condition of IGBT 24. During opening of the movable main contacts 18, voltage and current sensors 36, 37 included in hybrid DC contactor 10 functions to measure a level of voltage and current, respectively, across the contacts 18, as will be explained in greater detail below.

Figure 2:
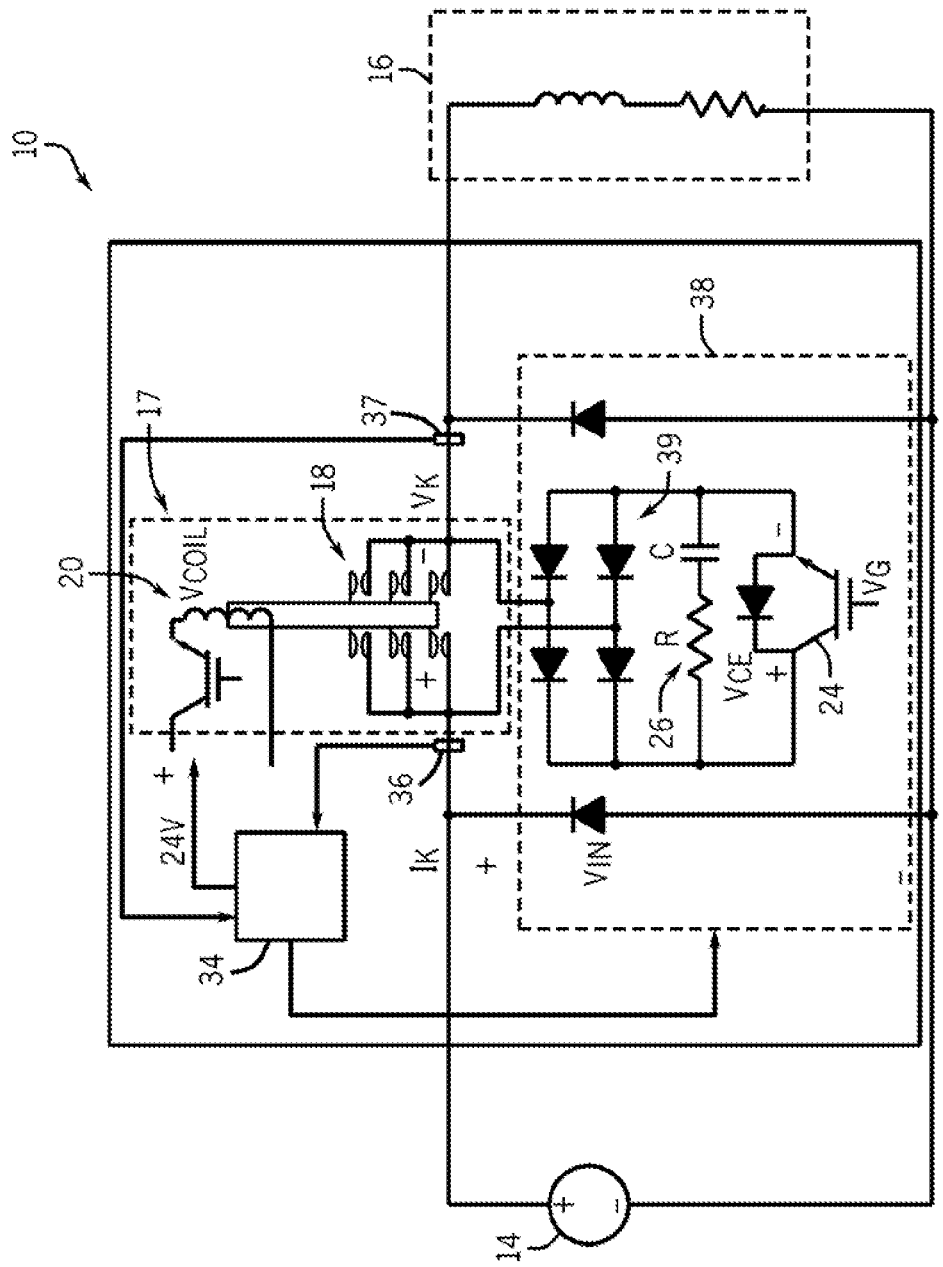
FIG. 2 is a schematic view of a power circuit incorporating a hybrid DC contactor according to another embodiment of the present invention.

While the hybrid DC contactor 10 in FIG. 1 is constructed as a unidirectional contactor with no galvanic isolation, it is recognized that hybrid DC contactors having other alternative constructions could also incorporated into a PV power system, according to different embodiments of the invention. For example, a hybrid DC contactor 10 is illustrated in FIG. 2 that is configured as a bidirectional contactor. As illustrated in FIG. 2, hybrid DC contactor 10 includes a solid state device 38 that enables operation of hybrid DC contactor 10 as a bidirectional contactor. The solid state device 38 includes a semiconductor switch 24, such as an insulated-gate bipolar transistor (IGBT) switch or other suitable switch and a snubber circuit 26 in parallel with the IGBT 24, along with a plurality of diodes 39 that function to selectively control current flow in a bidirectional manner. Free-wheeling diodes 32 on either side allow the flow of inductive load currents.

Figure 4:
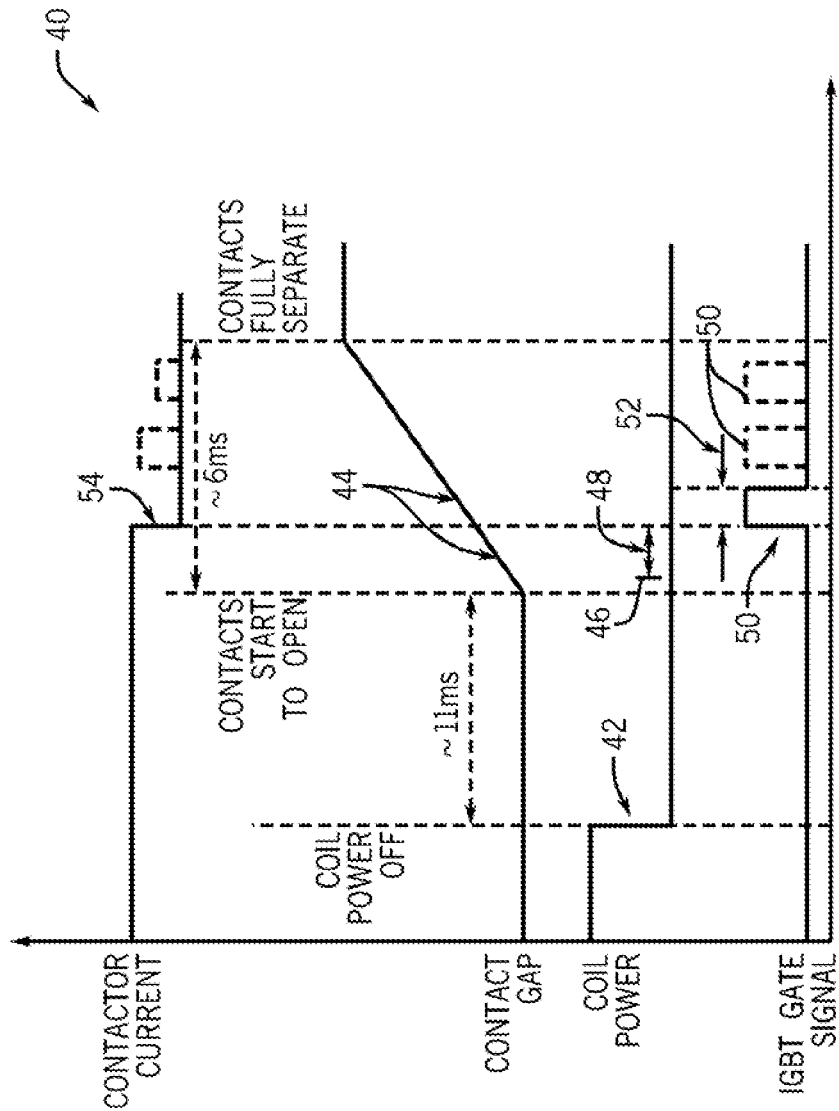

Referring now to FIGS. 3 and 4, and with continued reference to FIGS. 1 and 2, a flowchart and timeline, respectively, of a technique/control scheme 40 implemented by controller 34 for controlling operation of hybrid DC contactor 10 are illustrated, according to an embodiment of the invention. According to the controller implemented technique 40, when it is desired to actuate the movable main contacts 18 from a closed position to an open position, the controller 34 first acts to terminate a supply power to electromagnetic coil 20, illustrated at 42. The termination of power to electromagnetic coil 20 causes the movable main contacts 18 to begin to open after a minimal time (e.g., ~11 milliseconds), as indicated at 44. Upon actuation of the movable main contacts 18 being initiated, the controller 34 then acts to detect an arc voltage/contact arcing across the main contacts 18, indicated at 46. Once it is determined that contact arcing is present across the main contacts 18, the controller 34 then institutes a delay period, indicated at 48, before transmitting a gate signal to the IGBT 24 to turn the IGBT on, as indicated at 50. The delay period instituted by the controller 34 allows for the main contacts 18 to further separate and is of sufficient length that a re-strike voltage across the main contacts 18 is prevented.

After the delay period has passed, the technique 40 continues with the controller 34 transmitting a gate signal to the IGBT 24 to turn the IGBT on, as indicated at 50. As shown in FIGS. 3 & 4, according to an exemplary embodiment of the invention, the gate signal is a pulsed gate signal of a short duration that causes the IGBT 24 to be turned on for a pre-determined period of time, indicated at 52 (FIG. 4), after which the gate signal is terminated and the IGBT 24 is turned off. While the length of time for which the gate signal is pulsed to IGBT 24 may vary based on system requirements, according to one embodiment the IGBT 24 is pulsed on for 50 microseconds.

After the pulsed gate signal to the IGBT 24 is terminated, the controller 34 then measures a current through the main contacts 18, as indicated at 54, and determines whether current is still present or has been interrupted, as indicated at 55 (FIG. 3). If no current is detected through the main contacts 18, indicated at 56 (FIG. 3), then it is confirmed that the current has been interrupted, and thus the controller 34 does not generate/transmit any additional gate signals to the IGBT 24 to turn the IGBT on. However, if current is detected through the main contacts 18 after the pulsed gate signal to the IGBT 24, indicated at 57 (FIG. 3), then the controller 34 functions to initiate/institute a small delay to allow the IGBT 24 to cool, as indicated at 58, before providing another pulsed gate signal to the IGBT 24 to cause the IGBT 24 to again pulse on for another pre-determined period of time to again route current to the IGBT 24, as indicated at 50 (in phantom in FIG. 4). The controller 34 then repeats the process of measuring/monitoring a current through the main contacts 18 to determine whether current is still present or has been interrupted, and continues to intermittently provide additional pulsed gate signals to the IGBT 24 as long as current is detected through the main contacts 18. Again, while the length of time for which the gate signals are pulsed to IGBT 24 to turn on the IGBT may vary based on system requirements, according to one embodiment, each additional gate signal after the initial gate signal pulses the IGBT 24 on for 20 microseconds.

The intermittent pulsing of the gate signal to the IGBT 24 while the main contacts 18 are transitioning from the closed position to the open position provides/ensures that the IGBT 24 carries current for only very short durations, thus reducing losses and reducing the size of the IGBT 24 that is required. That is, by implementing the technique/control scheme 40, the size of the IGBT 24 can be reduced by approximately 30% on average. The wear experienced by main contacts 18 is also minimized by way of the pulsing of the IGBT 24, as the contacts arc for only a short time. Additionally, the technique/control scheme 40 for controlling hybrid DC contactor 10 reduces the time needed to open the main contacts 18 and circuit 12, with time reductions of 1-3 milliseconds being achievable. That is, by implementing the technique/control scheme 40, the delay for commuting the current with the IGBT 24 will be approximately 200 microseconds, with the current interrupting then occurring within an additional 50 microseconds.

Figure 5:
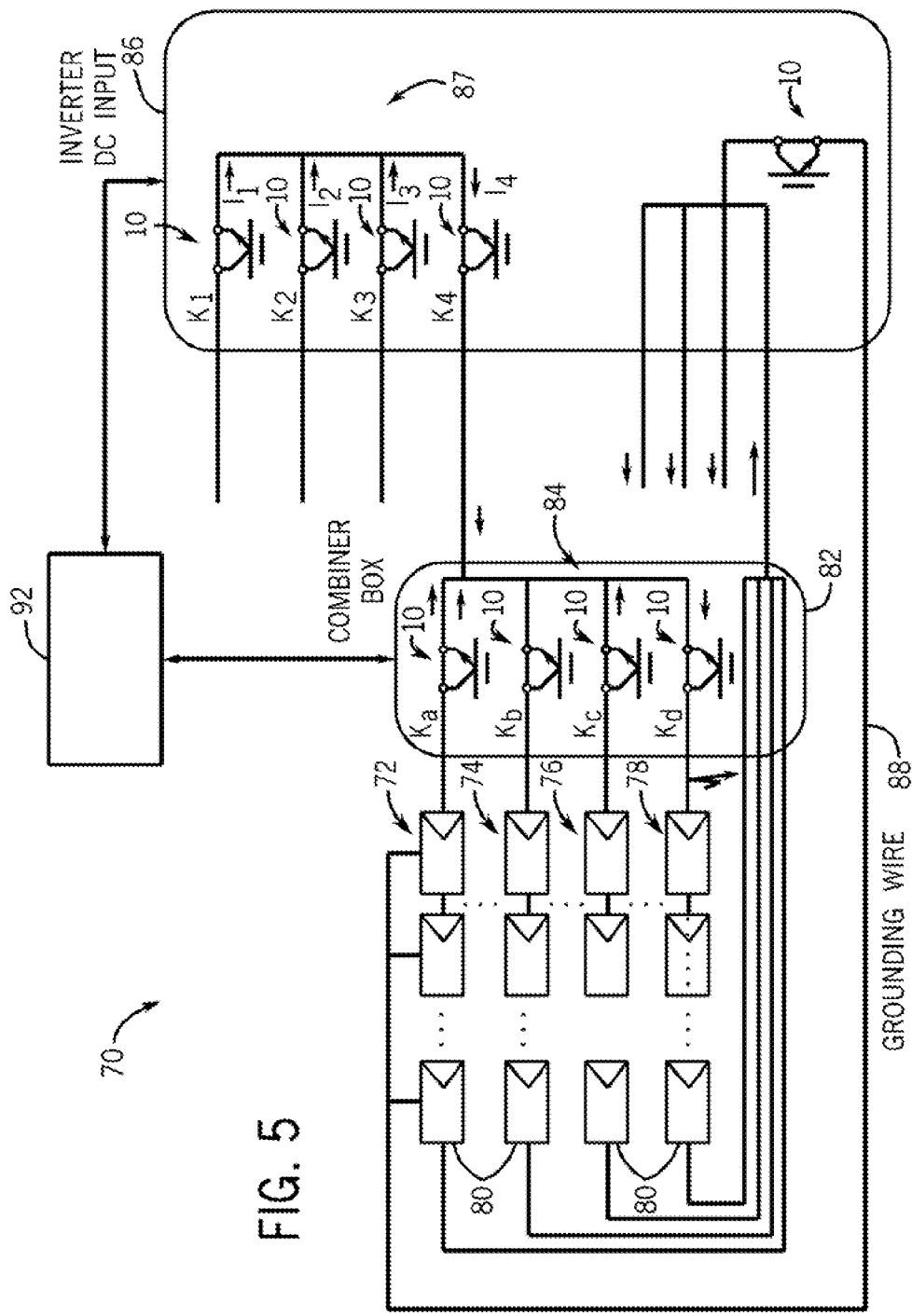
FIG. 5 is a schematic diagram of a PV system incorporating hybrid DC contactors according to an embodiment of the invention.

Referring now to FIG. 5, a photovoltaic (PV) power system 70 is illustrated that incorporates hybrid DC contactors, such as the hybrid DC contactors illustrated in FIGS. 1 and 2, according to an embodiment of the invention. As shown in FIG. 5, PV power system 70 includes a plurality of PV strings 72, 74, 76, 78, with each PV string being comprised of a plurality of PV modules 80 that are connected in series to generate a DC power. The PV strings 72, 74, 76, 78 are electrically connected in parallel to a combiner box 82 that houses a DC link or bus 84 therein. According to one embodiment, the combiner box 82 is in turn connected to a re-combiner box 86 having sub-arrays 87 therein. Also included in PV power system 70 is a grounding wire 88 that is connected to a plurality of PV modules 80 of a PV string, such as the modules 80 of PV string 72. The grounding wire 88 includes a hybrid DC contactor 10 positioned thereon that provides for ground leakage current detection and ground fault protection in the PV power system 70.

As shown in FIG. 5, hybrid DC contactors $K_a$, $K_b$, $K_c$, $K_d$ that correspond to the respective PV strings 72, 74, 76, 78 are included in combiner box 82 of PV power system 70, with a series of hybrid DC contactors $K_1$, $K_2$, $K_3$, $K_4$ also being included in re-combiner box 86. As indicated above, according to an exemplary embodiment of the invention, each of hybrid DC contactors $K_a$, $K_b$, $K_c$, $K_d$ and $K_1$, $K_2$, $K_3$, $K_4$ comprises a hybrid DC contactor 10 such as shown in FIGS. 1 and 2. The hybrid DC contactors $K_a$, $K_b$, $K_c$, $K_d$ and $K_1$, $K_2$, $K_3$, $K_4$ are thus generally referred to hereafter as "hybrid DC contactors 10." Therefore, as shown in the exemplary embodiments of FIGS. 1 and 2, the hybrid DC contactors 10 in PV power system 70 each include main contacts 18 and a solid state switching unit 22 that is connected in parallel with at least one of the main contacts 18, such that the solid state switching unit 22 provides a second, parallel current path that diverts current away from the main contacts 18 when the switching unit is turned on. According to one embodiment, the solid state switching unit 22 can include an IGBT that is selectively turned on and off to divert current away from the main contacts 18 as well as a snubber circuit that suppresses voltage transients. Each of the hybrid DC contactors 10 also includes DC voltage and current sensors 36, 37 that function to measure a magnitude and direction of current flow on a respective PV string.

Referring now again to FIG. 5, and with continued reference to FIGS. 1 and 2, the DC voltage and current sensors 36, 37 of hybrid DC contactors 10 function to measure a magnitude and direction of current flow in the PV power system 70, indicated as $I_1$, $I_2$, $I_3$, $I_4$, with the sensors measuring the magnitude and direction of current flow on the respective PV strings 72, 74, 76, 78 on which the sensors 36, 37 are positioned. Such measuring of the magnitude and direction of current flow is indicative of the condition of the associated PV string 72, 74, 76, 78, allowing for identification of an over-current condition, short circuit condition, or fault condition. For example, it is recognized that in a PV power system 70, a fault condition on a PV string is characterized by a current flow that is in a reverse direction from a current flow on a normally operating PV string, with the fault current also being many times greater than the current on a normally operating PV string, allowing for the identification of such a fault condition by way of the magnitude and direction of current flow. Similarly, a short circuit condition can be identified by detection of a current that is greater than a rated current of the PV power system, such as a current that is 1.1× the rated current or greater.

For diagnosing and addressing/correcting such over-current, short circuit, and fault conditions, a control system 92 is included in PV power system 70 that is capable of remotely identifying faulted PV strings in the PV power system. The control system 92 receives data from sensors 36, 37 on the magnitude and direction of current on each of the plurality of PV strings 72, 74, 76, 78. Based on the received current data, the control system 92 determines/detects any unwanted condition present on each respective PV string 72, 74, 76, 78. The control system 92 can then control operation of the hybrid DC contactors 10 accordingly so as to address any detected unwanted condition in the PV power system 70, such as by controlling the operation of the hybrid DC contactors 10 according to the technique illustrated in FIGS. 3 and 4, for example, with the controlling of the main contacts 18 and gating of the solid state switching device 22 being performed as described in detail above with respect to technique 40.

Figure 6:
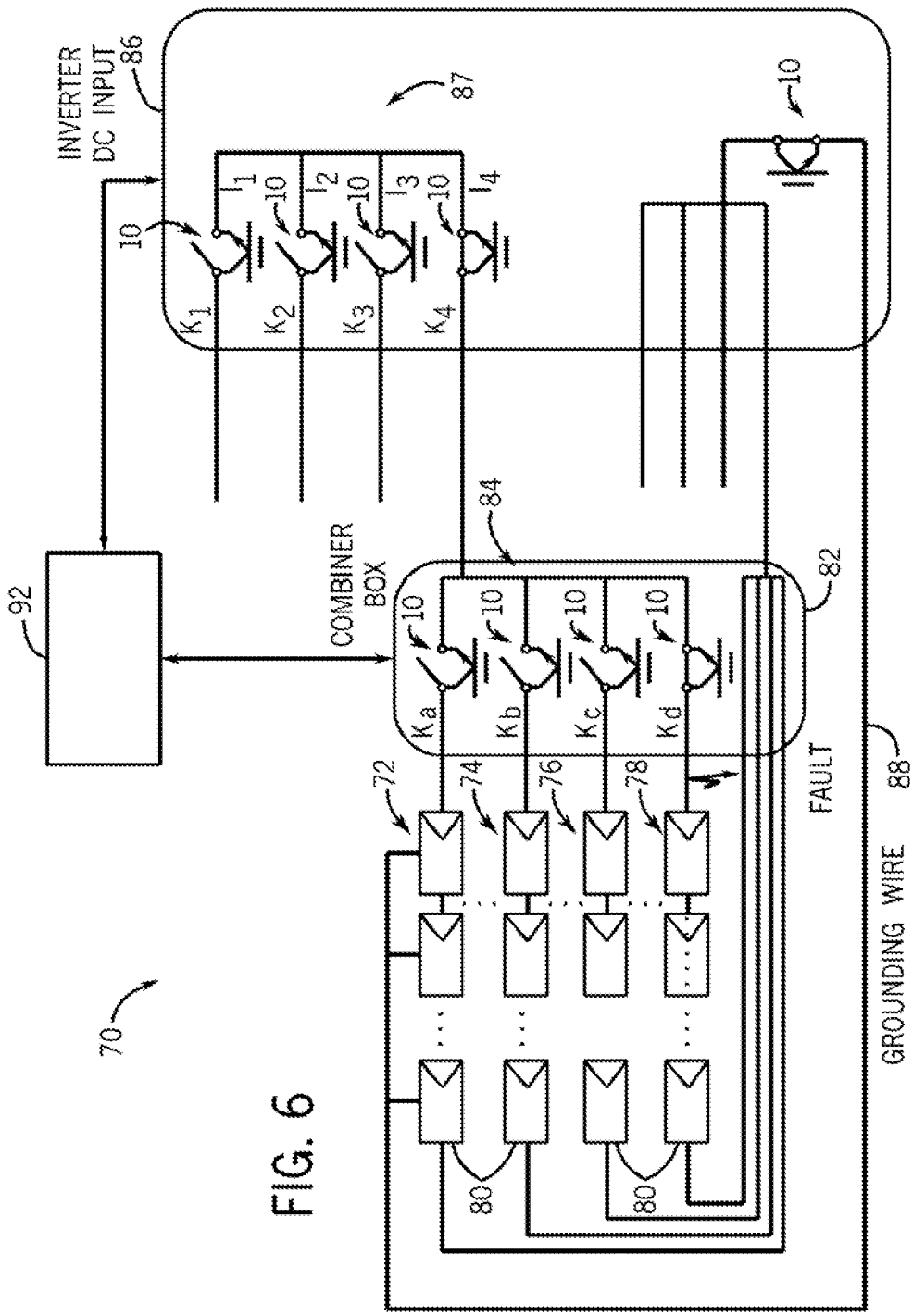
FIGS. 6-8 are schematic diagrams of the PV system of FIG. 5 at various steps of a fault correction process according to an embodiment of the invention.
Figure 7:
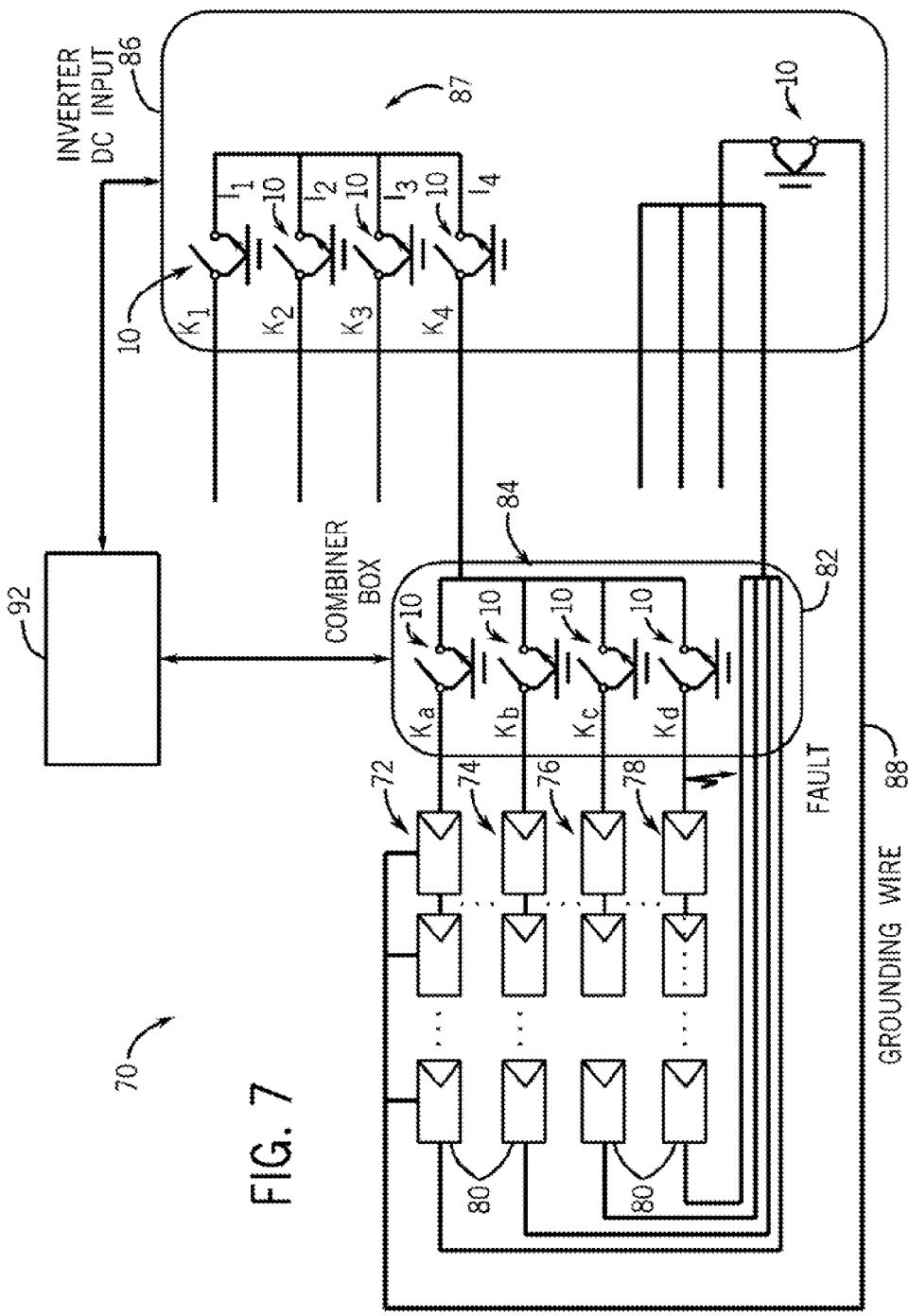
Figure 8:
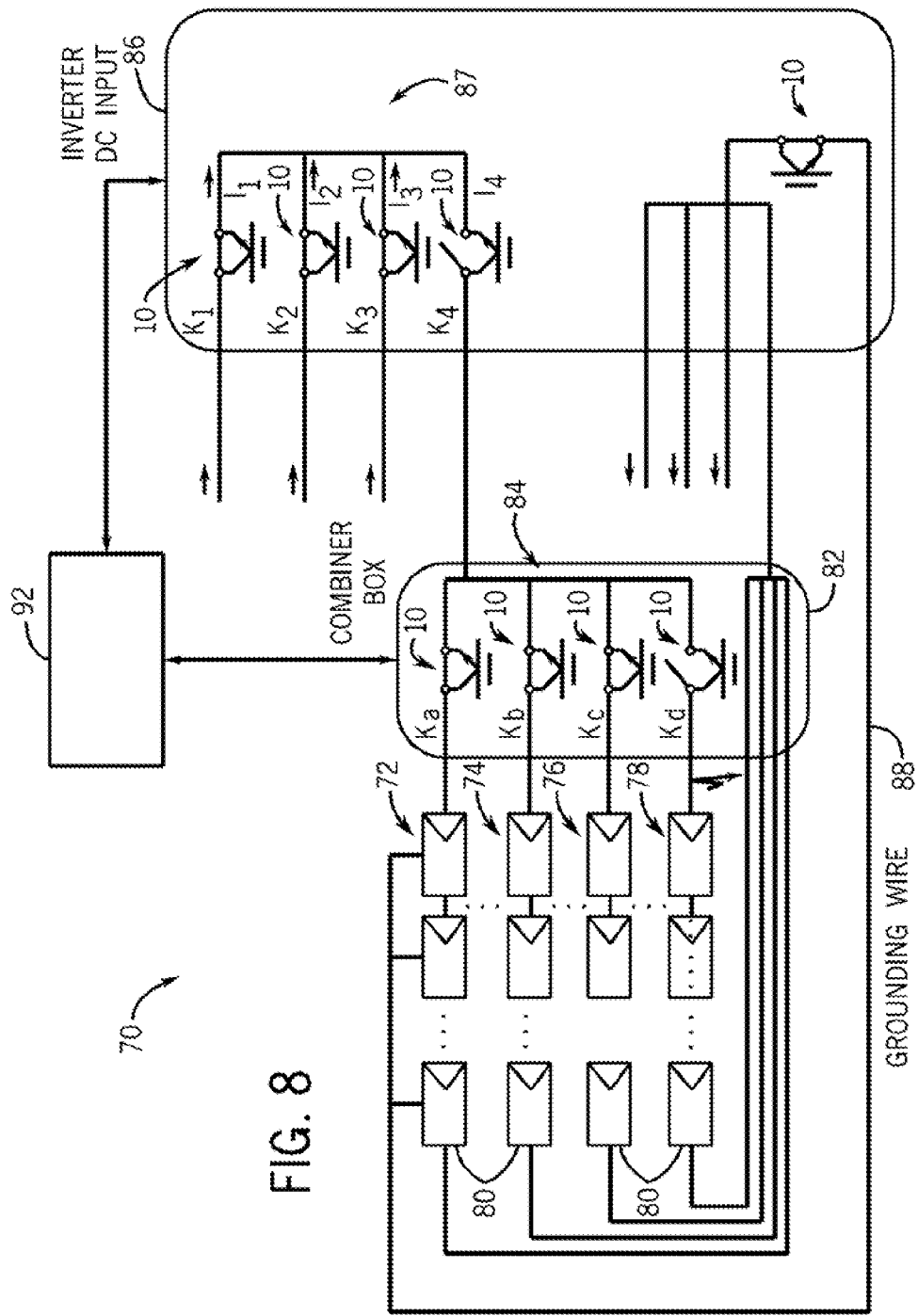

An example of control system 92 controlling hybrid DC contactors 10 to correct an unwanted condition in the PV power system 70 is illustrated in FIGS. 6-8, with various steps of the correction being shown. In the example of FIGS. 6-8, the PV string 78 is undergoing a fault, such as a short circuit fault, as can be seen by the current flow on PV string 78, indicated as $I_4$, as the current flow is in a reverse direction as compared to a normal current flow in PV power system 70, i.e., the current flows $I_1$, $I_2$, $I_3$ on PV strings 72, 74, 76 are flowing in a normal direction.

The short circuit fault condition is detected by control system 92 based on current data received from sensors 36, 37 (FIGS. 1 and 2) positioned on the PV strings 72, 74, 76, 78. More specifically, in operation, the controller 92 and hybrid DC contactors $K_1$, $K_2$, $K_3$, and $K_a$, $K_b$, $K_c$, detect the short circuit fault by monitoring the voltage on DC bus 84 in combiner box 82, such as by way of sensors 36, 37. The value of current $I_4$ on PV string 78 is also received by control system 92. Based on the voltage/current feedback received from the hybrid DC contactors $K_1$, $K_2$, $K_3$, $K_4$ and $K_a$, $K_b$, $K_c$, $K_d$, the control system 92 determines that a fault condition is present on PV string 78, while determining that PV strings 72, 74, 76 are operating in a normal/healthy condition.

As illustrated in FIG. 6, upon detection of the fault condition on PV string 78, the control system 92 acts to control operation of the hybrid DC contactor 10 on each of the PV strings 72, 74, 76, 78 in order to correct/address the fault condition on PV string 78. In correcting the fault condition, the control system 92 acts to cause the main contacts 18 (FIGS. 1 and 2) of the hybrid DC contactors 10 to remain closed on any PV string for which a fault condition is detected. Thus, for the exemplary fault condition in the PV power system 70 illustrated in FIG. 6, the main contacts 18 of the hybrid DC contactors $K_4$ and $K_d$ on PV string 78 are caused to remain closed by control system 92. Conversely, the control system 92 acts to cause the main contacts 18 of the hybrid DC contactor 10 to open on any PV string that is determined to be operating in a normal condition. Thus, for the exemplary fault condition in the PV power system 70 illustrated in FIG. 6, the main contacts 18 of the hybrid DC contactors $K_1$, $K_2$, $K_3$ and $K_a$, $K_b$, $K_c$ on PV strings 72, 74, 76 are caused to open by control system 92. By opening the main contacts 18 in the hybrid DC contactors $K_1$, $K_2$, $K_3$ and $K_a$, $K_b$, $K_c$ on PV strings 72, 74, 76, currents $I_1$, $I_2$, $I_3$ are interrupted on PV strings 72, 74, 76.

The interrupting of the current on PV strings 72, 74, 76 and the opening of K1, K2, and K3 causes the reverse current $I_4$ on PV string 78 to be zeroed. Once the current $I_4$ on PV string 78 is at zero, the hybrid DC contactors $K_4$ and $K_d$ on PV string 78 are caused to open by control system 92, as illustrated in FIG. 7. Subsequently, and as illustrated in FIG. 8, the controller 92 causes hybrid DC contactors $K_1$, $K_2$, $K_3$ and $K_a$, $K_b$, $K_c$ on PV strings 72, 74, 76 to re-close, while the hybrid DC contactor $K_d$ on PV string 78 is maintained in the open position, such that the fault condition on the PV string 78 is isolated and cleared. This is referred to as back-feed current into the faulted string, and the DC contactors that do not have a fault on the source side will open and stop the back-feed current, thereby allowing the DC Hybrid contactor in the faulted string to isolate the string from healthy strings. The contactor k4 is latched in the off position till manually reset. After clearing of the fault condition, the control system 92 then causes the hybrid DC contactors $K_4$ and $K_d$ on the PV string 78 to reclose, such as illustrated in FIG. 5, so as to enable continued operation of the PV power system 70 in a normal and healthy condition.

Figure 9:
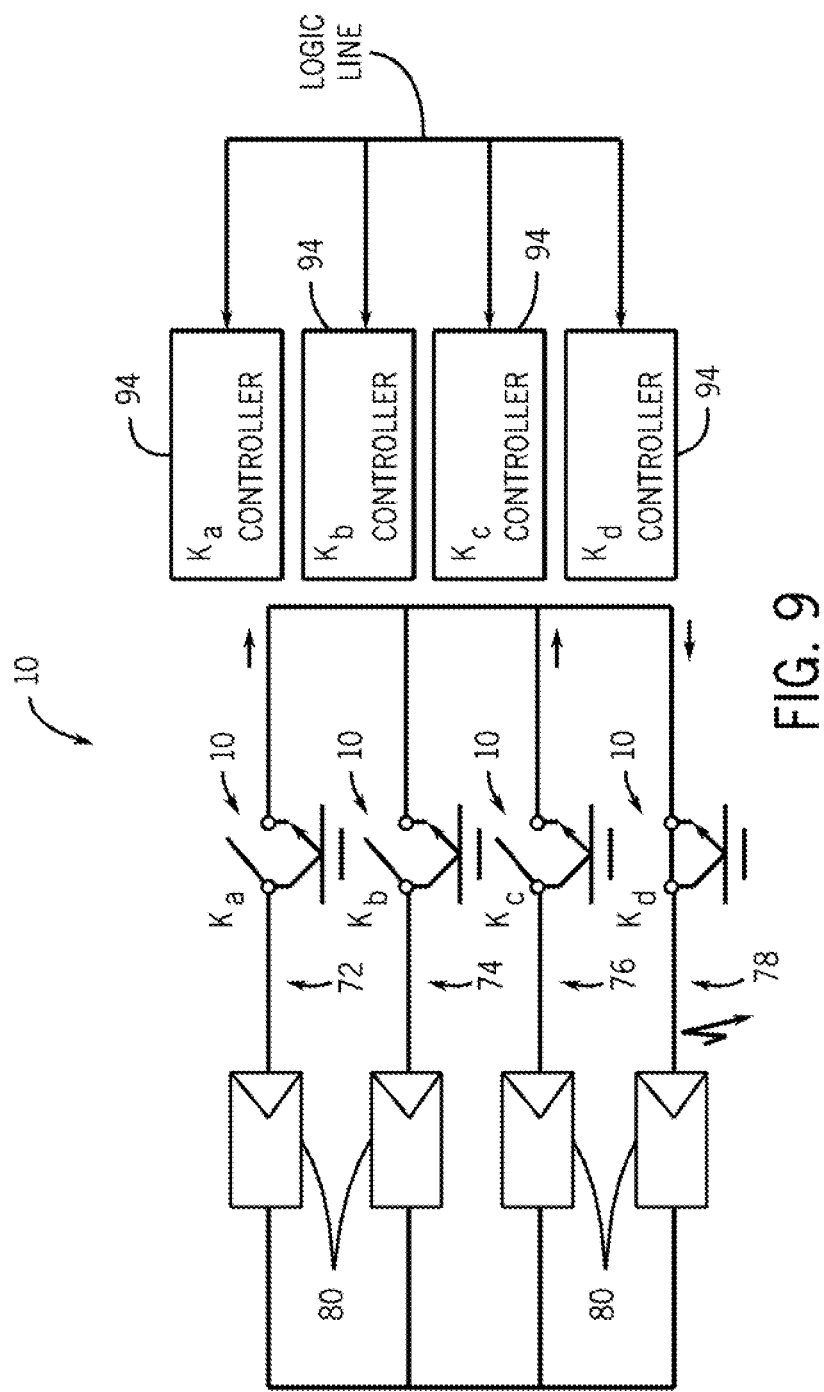
FIG. 9 is a schematic diagram of a portion of a PV system incorporating hybrid DC contactors and wired logic controllers according to an embodiment of the invention.

Referring now to FIG. 9, a portion of PV power system 70 is shown according to another embodiment of the invention. In the embodiment of FIG. 9, an alternative approach for controlling operation of hybrid DC contactors 10 is provided that does not employ a central controller 92 (such as shown in FIGS. 5-8). As an alternative to central controller 92, individual hybrid DC contactor controllers 94 corresponding to each contactor 10. The controllers 94 incorporate a wired logic connection or logic gate therein that create a simple wired OR function. The hybrid DC contactor controllers 94 can be included within a combiner box or re-combiner box, for example. In operation, a hybrid DC contactor controller 94 that is wired to the faulted circuit, such as $K_d$ controller on circuit 78 in FIG. 9, will detect a fault and pull the fault wire to logic low, thereby causing the hybrid DC contactor 10 (i.e., contactor $K_d$) to remain closed. All hybrid DC contactor controllers 94 that do not see a fault in their circuit, such as $K_a$, $K_b$, and $K_c$ controllers on circuits 72, 74, 76 in FIG. 9, will open the hybrid DC contactors 10 (i.e., contactors $K_a$, $K_b$, and $K_c$) and clear the fault current in the faulted circuit. Once the healthy circuits 72, 74, 76 are open, the hybrid DC contactor 10 in the faulted circuit 78 will open and clear the fault.

Figure 10:
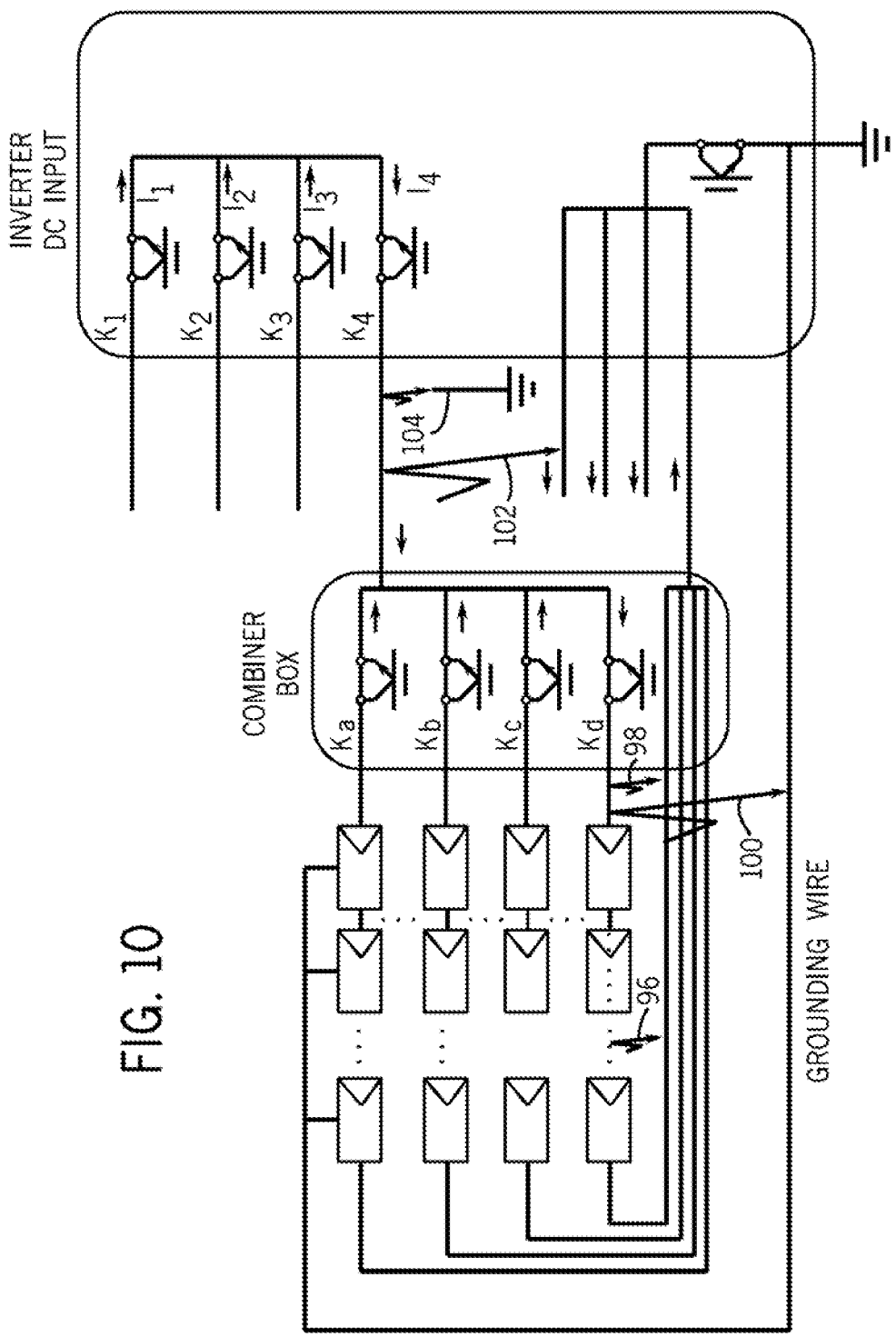
FIG. 10 is a schematic diagram of a PV system incorporating hybrid DC contactors, highlighting different types of faults in the PV system that are detected and addressed, according to an embodiment of the invention.

Referring now to FIG. 10, PV power system 70 is illustrated with different types of faults highlighted thereon that are identified, addressed, and corrected according to embodiments of the invention. As shown in FIG. 10, inter-string short circuits 96, string short circuits 98, string ground faults, combiner output short circuits, and combiner output ground or leakage faults, are all detectable in PV power system 70, based on the operations and control provided by hybrid DC contactors 10 and central controller 92 and/or individual hybrid DC contactor controllers 94. A comprehensive fault detection and protection scheme covering a plurality of types and locations of faults is thus provided for PV power system 70.

Beneficially, the incorporation of hybrid DC contactors 10 (such as shown in FIGS. 1 and 2) into PV power system 70 and the control thereof by controller 92 (or individual controllers 94) provides over-current and short circuit detection and protection at "low" short circuit current magnitudes, such as down to 1.1× the rated current, at which fuses and circuit breakers cannot open. The use of hybrid DC contactors 10 in PV power system 70 also provides for monitoring of both voltage and current for enabling over-current protection, as well as arc fault detection and reverse current detection and fault isolation, including isolation of grounded arrays and floating arrays. In floating arrays, the controller can detect a fault and isolate both ends of the array, with a dual contactor system being used to isolate the positive and negative cables of the faulted circuit from the other healthy sub-arrays and strings. The hybrid DC contactors 10 can replace standard fuses and/or breakers in a PV power system 70, while also providing the capability to reclose the contacts after isolating and correcting a faulted circuit, as opposed to fuses/breakers that cannot be reset or reclosed. The use of hybrid DC contactors 10 in PV power system 70 also provides fast and consistent openings times (e.g., less than 10 milliseconds) of main contacts 18. Furthermore, hybrid DC contactors 10 and control system 92 (or individual controllers 94) enable healthy PV strings to continue to supply power while the fault condition on the faulted PV string is being addressed, such that the PV power system 70 can continue to operate even while the fault is being addressed.

Embodiments of the invention thus provide a PV power system that incorporates hybrid DC contactors in order to provide for unique autonomous fault current detection in individual PV strings and a control system that employs logic for purposes of clearing faults and restoring healthy sub-arrays/PV strings.

A technical contribution for the disclosed method and apparatus is that it provides for unique autonomous fault current detection in individual PV strings of a PV power system and clearing faults and restoring healthy sub-arrays or PV strings. Hybrid DC contactors and control system(s) are incorporated into the PV power system for enabling such functioning.

Therefore, according to one embodiment of the present invention, a photovoltaic (PV) power system includes a plurality of PV strings configured to generate a string output power responsive to received solar irradiation and a combiner box having a DC link therein connected to the plurality of PV strings, wherein the plurality of PV strings are connected to the DC link in a parallel arrangement. The PV power system also includes a hybrid direct current (DC) contactor positioned in the combiner box and corresponding to each of the plurality of PV strings, with each hybrid DC contactor having main contacts movable between a closed position and an open position, a solid state switching unit positioned in parallel with the main contacts and that includes a semiconductor switch that, when turned on, diverts current away from the main contacts, and sensors configured to measure a voltage and current on the respective PV string. The PV power system further includes a controller configured to receive voltage and current data from respective sensors on each of the plurality of PV strings, detect a fault condition on a respective PV string based on the received voltage and current data, cause the main contacts of a respective hybrid DC contactor to remain closed on each PV string for which a fault condition is detected, and cause the main contacts of a respective hybrid DC contactor to open on each PV string for which no fault condition is detected, so as to clear the fault condition.

According to another embodiment of the present invention, a photovoltaic (PV) power system including a plurality of PV strings configured to generate a string output power responsive to received solar irradiation, a combiner box connected to the plurality of PV strings and including a DC link therein to which the plurality of PV strings are connected in a parallel arrangement, a re-combiner box connected to the combiner box and including a plurality of sub-arrays therein corresponding to the plurality of PV strings, and a plurality of hybrid direct current (DC) contactors positioned in the combiner box and re-combiner box on each of the plurality of PV strings and each of the plurality of sub-arrays. Each hybrid DC contactor includes main contacts movable between a closed position and an open position, a solid state switching unit positioned in parallel with the main contacts that includes a semiconductor switch that, when turned on, diverts current away from the main contacts, and sensors configured to measure a voltage and current. The PV power system also includes a controller configured to receive voltage and current data from respective sensors, detect a fault condition on a respective PV string or sub-array based on the received current data, and control an opening and closing of the main contacts of the respective hybrid DC contactors in order to isolate and clear the fault condition.

According to yet another embodiment of the present invention, a method of controlling operation of a photovoltaic (PV) power system includes measuring at least one of a voltage and current for a plurality of PV strings in the PV system, detecting a fault condition on a respective PV string based on the at least one of the measured voltage and current, and controlling operation of a plurality of hybrid DC contactors connected to the a plurality of PV strings in order to isolate and clear the fault condition. The step of controlling operation of the plurality of hybrid DC contactors further includes causing main contacts of a respective hybrid DC contactor to remain closed on each PV string for which a fault condition is detected and causing the main contacts of a respective hybrid DC contactor to open on each PV string for which no fault condition is detected, so as to clear the fault condition.

The present invention has been described in terms of the preferred embodiment, and it is recognized that equivalents, alternatives, and modifications, aside from those expressly stated, are possible and within the scope of the appending claims.

What is claimed is:

1. A photovoltaic (PV) power system comprising:
a plurality of PV strings configured to generate a string output power responsive to received solar irradiation;
a combiner box having a DC link therein connected to the plurality of PV strings, wherein the plurality of PV strings are connected to the DC link in a parallel arrangement; and
a hybrid direct current (DC) contactor positioned in the combiner box and corresponding to each of the plurality of PV strings, each hybrid DC contactor comprising:
main contacts movable between a closed position and an open position;
a solid state switching unit positioned in parallel with the main contacts, the solid state switching unit including a semiconductor switch that, when turned on, diverts current away from the main contacts; and
sensors configured to measure a voltage and current on the respective PV string; and
a controller configured to:
receive voltage and current data from respective sensors on each of the plurality of PV strings;
detect a fault condition on a respective PV string based on the received voltage and current data;
cause the main contacts of a respective hybrid DC contactor to remain closed on each PV string for which a fault condition is detected; and
cause the main contacts of a respective hybrid DC contactor to open on each PV string for which no fault condition is detected, so as to clear the fault condition.

2. The PV power system of claim 1 wherein, in detecting a fault condition on a respective PV string, the dc hybrid contactor controller is further configured to monitor the voltage on the DC link for purposes of identifying a fault.

3. The PV power system of claim 1 wherein, in detecting a fault condition on a respective PV string, the controller is further configured to:
determine a direction of current flow on each PV string based on the received current data; and
identify any PV strings in which the direction of current flow is reversed, as compared to a normal current flow, as having a fault condition.

4. The PV power system of claim 1 wherein, in detecting a fault condition on a respective PV string, the controller is further configured to detect a short circuit current condition on a respective PV string based on the received current data by detecting an over-current condition on a respective PV string of a current that is 1.1 times the rated current or greater.

5. The PV power system of claim 1 wherein the controller is further configured to:
cause the main contacts of the hybrid DC contactor on each PV string for which a fault condition was detected to open at zero current after opening of the main contacts of the hybrid DC contactor on each PV string for which no fault condition was detected, so as to isolate and clear the fault condition; and
cause the main contacts of the hybrid DC contactor on each PV string for which no fault condition was detected to reclose after clearing of the fault condition, so as to enable continued operation of the PV power system.

6. The PV power system of claim 1 wherein the PV strings on which no fault condition is detected continue to supply power while the fault condition is being addressed.

7. The PV power system of claim 1 further comprising a re-combiner box including a plurality of sub-arrays therein corresponding to the plurality of PV strings, wherein a plurality of hybrid DC contactors are included on the plurality of sub-arrays to provide for isolation and clearing of the fault condition.

8. The PV power system of claim 1 wherein the controller is configured to automatically perform the opening and closing of the main contacts in each of the plurality of hybrid DC contactors, without any manual control input.

9. The PV power system of claim 1 wherein the hybrid DC contactors provide arc-fault detection and isolation.

10. The PV power system of claim 1 further comprising a grounding wire including a hybrid DC contactor positioned thereon, wherein the hybrid DC contactor on the grounding wire is configured to provide ground fault detection and isolation for the PV power system.

11. The PV power system of claim 1 wherein the PV strings comprise a floating array, with the controller being configured to detect a fault and isolate both ends of the floating array; and
wherein the hybrid DC contactors comprise a dual contactor system configured to isolate positive and negative cables of a faulted circuit from other healthy sub-arrays and PV strings.

12. A photovoltaic (PV) power system comprising:
a plurality of PV strings configured to generate a string output power responsive to received solar irradiation;
a combiner box connected to the plurality of PV strings and including a DC link therein to which the plurality of PV strings are connected in a parallel arrangement;
a re-combiner box connected to the combiner box and including a plurality of sub-arrays therein corresponding to the plurality of PV strings;
a plurality of hybrid direct current (DC) contactors positioned in the combiner box and re-combiner box on each of the plurality of PV strings and each of the plurality of sub-arrays, each hybrid DC contactor comprising:
main contacts movable between a closed position and an open position;
a solid state switching unit positioned in parallel with the main contacts, the solid state switching unit including a semiconductor switch that, when turned on, diverts current away from the main contacts; and
sensors configured to measure a voltage and current; and
a controller configured to:
receive voltage and current data from respective sensors;
detect a fault condition on a respective PV string or sub-array based on the received current data;
control an opening and closing of the main contacts of the respective hybrid DC contactors in order to isolate and clear the fault condition.

13. The PV power system of claim 12 wherein, in controlling the opening and closing of the main contacts, the controller is further configured to:
cause the main contacts of a respective hybrid DC contactor to remain closed on each PV string or sub-array for which a fault condition is detected; and
cause the main contacts of a respective hybrid DC contactor to open on each PV string or sub-array for which no fault condition is detected, so as to clear the fault condition.

14. The PV power system of claim 13 wherein, in controlling the opening and closing of the main contacts, the controller is further configured to:
cause the main contacts of the hybrid DC contactor on each PV string or sub-array for which a fault condition was detected to open at zero current after opening of the main contacts of the hybrid DC contactor on each PV string or sub-array for which no fault condition was detected, so as to isolate and clear the fault condition; and cause the main contacts of the hybrid DC contactor on each PV string or sub-array for which no fault condition was detected to reclose after clearing of the fault condition, so as to enable continued operation of the PV power system.

15. The PV power system of claim 12 wherein, in detecting a fault condition on a respective PV string or sub-array, the controller is further configured to
monitor the voltage on the DC link;
determine a direction of current flow on each PV string and sub-array; and
identify any PV strings or sub-arrays having a fault condition based on the DC link voltage and the direction of current flow.

16. The PV power system of claim 12 wherein, in detecting a fault condition on a respective PV string, the controller is further configured to detect an over-current condition on a respective PV string or sub-array by detecting a magnitude of current that is 1.1 times the rated current or greater.

17. A method of controlling operation of a photovoltaic (PV) power system comprising:
measuring at least one of a voltage and current for a plurality of PV strings in the PV system;
detecting a fault condition on a respective PV string based on the at least one of the measured voltage and current;
controlling operation of a plurality of hybrid DC contactors connected to the plurality of PV strings in order to isolate and clear the fault condition, wherein controlling operation of the plurality of hybrid DC contactors comprises:
causing main contacts of a respective hybrid DC contactor to remain closed on each PV string for which a fault condition is detected; and
causing the main contacts of a respective hybrid DC contactor to open on each PV string for which no fault condition is detected, so as to clear the fault condition.

18. The method of claim 17 further comprising:
causing the main contacts of the hybrid DC contactor on each PV string for which a fault condition was detected to open at zero current after opening of the main contacts of the hybrid DC contactor on each PV string for which no fault condition was detected, so as to isolate and clear the fault condition; and
cause the main contacts of the hybrid DC contactor on each PV string for which no fault condition was detected to reclose after clearing of the fault condition, so as to enable continued operation of the PV power system.

19. The method of claim 17 wherein measuring at least one of the voltage and current for the plurality of PV strings comprises at least one of:
measuring the voltage on a DC link to which the PV strings are connected in parallel; and
determining a magnitude and direction of current flow on each PV string.

20. The method of claim 17 wherein the hybrid DC contactors are included in at least one of a combiner box and a re-combiner box of the PV power system.

21. The method of claim 17 wherein each hybrid DC contactor comprises:
main contacts movable between a closed position and an open position;
a solid state switching unit positioned in parallel with the main contacts, the solid state switching unit including a semiconductor switch that, when turned on, diverts current away from the main contacts; and
sensors configured to measure a voltage and current on the respective PV string.

22. The method of claim 17 wherein controlling operation of the plurality of hybrid DC contactors comprises employing a wired logic to turn-on and turn-off individual hybrid DC contactors.

23. The method of claim 22 wherein individual hybrid DC contactors are turned-on and turned-off based on the fault detection as determined by the measured voltage and current.

24. The method of claim 17 further comprising locating a ground fault associated with a PV string.

25. The method of claim 17 further comprising detecting the fault by way of an arc fault detecting circuit.

* * * * *